(12) United States Patent
Noguchi et al.

(10) Patent No.: US 11,237,834 B2
(45) Date of Patent: Feb. 1, 2022

(54) MEMORY DEVICE, ACCESS CONTROLLER THEREOF AND METHOD FOR ACCESSING MEMORY DEVICE

(71) Applicant: Taiwan Semiconductor Manufacturing Co., Ltd., Hsinchu (TW)

(72) Inventors: Hiroki Noguchi, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/923,107

(22) Filed: Jul. 8, 2020

(65) Prior Publication Data

US 2021/0271479 A1  Sep. 2, 2021

Related U.S. Application Data

(60) Provisional application No. 62/982,074, filed on Feb. 27, 2020.

(51) Int. Cl.
*G06F 9/30* (2018.01)
*G06F 11/10* (2006.01)

(52) U.S. Cl.
CPC ........ *G06F 9/30189* (2013.01); *G06F 9/3016* (2013.01); *G06F 11/1044* (2013.01); *G06F 11/1068* (2013.01)

(58) Field of Classification Search
CPC ............. G06F 11/1044; G06F 9/30189; G06F 11/1068
See application file for complete search history.

(56) References Cited

U.S. PATENT DOCUMENTS

| 2015/0254136 A1* | 9/2015 | Hoya | G06F 11/1012 714/764 |
| 2015/0309861 A1* | 10/2015 | Takahashi | G11C 29/52 714/758 |
| 2018/0074730 A1* | 3/2018 | Inoue | G06F 3/0616 |

\* cited by examiner

*Primary Examiner* — Zachary K Huson
(74) *Attorney, Agent, or Firm* — JCIPRNET

(57) ABSTRACT

A memory device includes a memory array with at least one memory macro, a flag, and a controller. The controller is coupled to the memory array. Each bit of data stored in the at least one memory macro is presented as a first bit type or a second bit type. The controller is configured to select one of a first situation mode and a second situation mode as a selected situation mode according to a first retention time of the first bit type and a second retention time of the second bit type. The first situation mode is that a number of bits with the first bit type in data is larger than a number of bit with the second bit type in data, and the second situation mode is that the number of bit with the first bit type in data is not larger than the number of bits with the second bit type in data. In a write operation of the at least one memory macro, the controller determines that an input data is meet the selected situation mode or not. In response to the input data is meet the selected situation mode, the controller disables the flag and writes the input data into the at least one memory macro. In response to the input data is not meet the selected situation mode, the controller enables the flag, inverts the input data, and writes an inverted input data into the at least one memory macro.

20 Claims, 11 Drawing Sheets

MEMORY DEVICE, ACCESS CONTROLLER THEREOF AND METHOD FOR ACCESSING MEMORY DEVICE

CROSS-REFERENCE TO RELATED APPLICATION

This application claims the priority benefit of U.S. provisional application Ser. No. 62/982,074, filed on Feb. 27, 2020. The entirety of the above-mentioned patent application is hereby incorporated by reference herein and made a part of this specification.

BACKGROUND

The present disclosure relates to a memory device for data store, and more particularly relates to the memory device, an access controller thereof, and a method for accessing the memory device of asymmetric data store.

One of leading technology in a semiconductor manufacture is a memory device. The memory device contributes a significant impact on the development of electronic devices. Capability to store data for a long period of time is one of objectives of the memory device development. Maintaining data to be stored in the memory device as long as possible is crucial, especially for privacy data i.e., password, credit card number, identity verification code, fingerprint profile, etc. Due to the manufacturing technology, each memory cell in the memory device has two different phases. However, due to the limitation of the current technology, the retention time of both phases is different. Moreover, during write operation, data may be stored to the memory cells as the phase having a lower retention time. As a result, the data stored as the lower retention time phase may be deteriorate faster than the data stored as a higher retention time phase. Thus, the data stored in the memory cells become defective and the correctness of the data cannot be maintained for a long period of time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
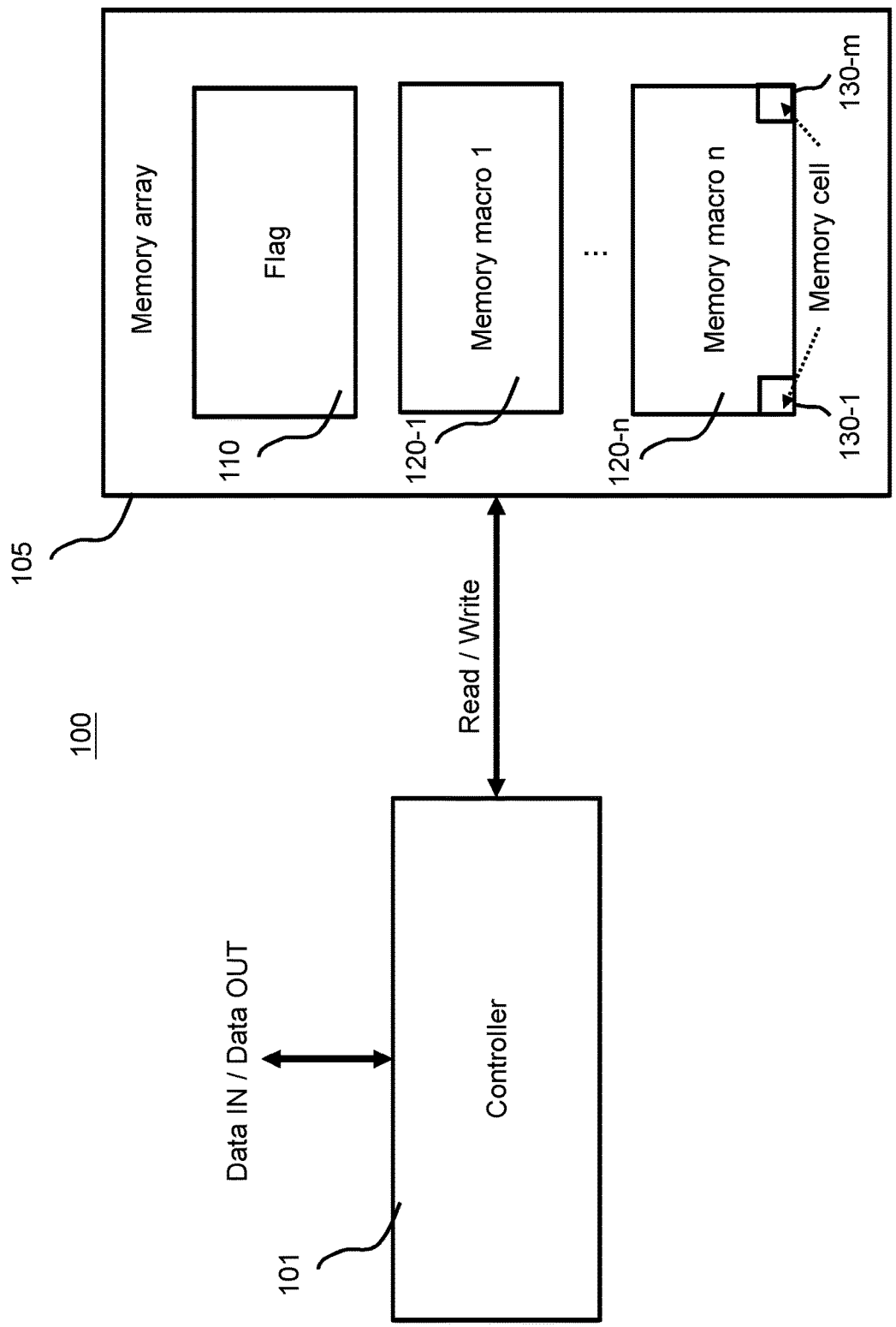
FIG. 1 illustrates a block diagram of a memory device according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a block diagram of a memory device including a controller and a memory array including at least one memory macro and a flag for indicating an asymmetric data store in a memory array according to an embodiment of the disclosure.

Referring to FIG. 1, the memory device 100 includes a memory array 105 and a controller 101. The memory array 105 includes a flag 110 and at least one memory macro. The memory array may include a plurality of memory macro 120-1 to 120-$n$. Each memory macro (i.e., 120-$n$) includes a plurality of memory cells 130-1 to 130-$m$. m and n are positive integer numbers. In the embodiment, the memory device 100 may be a flash memory device or a DRAM device. The flag 110 may be implemented as a memory cell. The flag 110 may be implemented as a plurality of memory cells. The flag 110 may be embedded in the memory array 105. The flag 110 may be located outside the memory array 105. The flag may be embedded in the memory macro (i.e., 120-1). The flag 110 may has an "L" type and/or an "H" type. The flag 110 may be set to "0" or "1". The type and the location of the flag 110 are not limited thereto. In the embodiment, the controller 101 may be a processor, a field programmable gate array (FPGA), an application specific integrated circuit (ASIC), or any integrated programmable on chip. The controller 101 may has a data terminal for input data (Data IN) and output data (Data OUT) and a Read/Write terminal to write data to the at least one memory macro (i.e., 120-1) and read data from the at least one memory macro (i.e., 120-1).

In the embodiment of FIG. 1, each bit of data stored in the at least one memory macro (i.e., 120-1) is presented as a first bit type or a second bit type. The first bit type may be an "L" type and the second bit type may be an "H" type. The first bit type may be an "H" type and the second bit type may be an "L" type. The first bit type may be set to "0" and the second bit type may be set to "1". The first bit type may be set to "1" and the second bit type may be set to "0". The first bit type and the second bit type may be applied in each memory cells 130-1 to 130-m of the at least one memory macro (i.e., 120-1).

In this embodiment, the controller 101 is coupled to the memory array and conducts read/write operation. The controller 101 is configured to select one of a first situation mode and a second situation mode as a selected situation mode according to a first retention time of the first bit type and a second retention time of the second bit type. The first situation mode is that a number of bits with the first bit type in data is larger than a number of bits with the second bit type in data. The second situation mode is that the number of bits with the first bit type in data is not larger than the number of bits with the second bit type in data.

For example, the controller 101 reads a data as an input data. The input data may have a plurality of bits. The plurality of bits may include the first bit type and the second bit type. The controller 101 calculates the number of first bit types and the number of second bit types. The controller 101 further performs a comparison between the number of first bit types and the number of second bit types. On the other hand, the controller 101 may selects one memory macro (i.e., 120-1). The controller 101 further selects one memory cell (i.e., 130-1) in the memory macro 120-1. The controller 101 further obtains the first retention time of the first bit type of the memory cell 130-1. The first retention time may be a capability of the memory cell 130-1 to store data as the first bit type during a period of time. The period of time may be 1 year or 10 years, but not limited thereto. The controller 101 further obtains the second retention time of the second bit type of the memory cell 130-1. The second retention time may be a capability of the memory cell 130-1 to store data as the second bit type during a period of time. The period of time may be 1 year or 10 years, but not limited thereto. The controller 101 further performs a comparison between the first retention time and the second retention time of the memory cell 130-1. The controller 101 further performs a comparison between the first retention time and the second retention time of the memory cell 130-2 to 130-m of the memory macro 120-1.

That is, the controller 101 performs to the input data the comparison between the number of first bit types and the number of second bit types of the input data. Accordingly, the controller 101 performs to the memory macro 120-1 the comparison between the first retention time and the second retention time of the memory macro 120-1. As a result, the controller 101 is able to selects the first situation mode or the second situation mode according to the result of the comparison between the number of first bit types and the number of second bit types of the input data and the result of the comparison between the first retention time and the second retention time of the memory macro 120-1.

For example, the controller 101 selects the first situation mode in condition if the number of first bit types is greater than the number of second bit types and the first retention time is greater than the second retention time. The controller 101 selects the first situation mode in condition if the number of first bit types is less than the number of second bit types and the first retention time is greater than the second retention time. On the other hand, the controller 101 selects the second situation mode in condition if the number of first bit types is greater than the number of second bit types and the first retention time is less than the second retention time. The controller 101 selects the second situation mode in condition if the number of first bit types is less than the number of second bit types and the first retention time is less than the second retention time.

That is, the controller 101 is able to perform a selection of one of the first situation mode and the second situation mode according to the first retention time of the first bit type and the second retention time of the second bit type and according to the number of bits with the first bit type and the number of bit with the second bit type in data.

In this embodiment, in a write operation of the at least one memory macro (i.e., 120-1), the controller 101 determines that the input data meets a condition for the selected situation mode or not. The selected situation mode is either the first situation mode or the second situation mode. The selected situation mode is obtained according to the number of first bit types and the number of second bit types of the input data and the first retention time and the second retention time of the at least one memory macro (i.e., 120-1).

During the write operation, the controller 101 reads the input data. The controller 101 further obtains the number of first bit types and the number of second bit types of the input data. Accordingly, the controller 101 obtains the first retention time and the second retention time of the at least one memory macro (i.e., 120-1). The process of obtaining the first retention time and the second retention time has been described in the previous part, so that, the process will not be repeated. For example, in response to the number of first bit types is greater than the number of second bit types and the first retention time is greater than the second retention time of the at least one memory macro (i.e., 120-1), the controller 101 selects the first situation mode as the selected situation mode. The process of obtaining the selected situation mode has been described in the previous part, so that, the process will not be repeated.

That is, in the write operation, the controller 101 determines that the input data meets a condition for either the first situation mode or the second situation mode. As a result, the controller 101 is able to store data to the at least one memory macro according to the retention time of the at least one memory macro.

In this embodiment, in response to the input data meets a condition for the selected situation mode, the controller 101 disables the flag 110 and writes the input data into the at least one memory macro (i.e., 120-1). As described in the previous part, the flag 110 may be set to "0" or "1". For example, the controller 101 disables the flag 110 by setting the flag 110 to "0". The controller 101 may also disables the flag 110 by setting the flag 110 to "1".

The process of disabling the flag 110 and the process of writing the input data in compliance with the disabled flag 110 will be described as follows. As described in the previous part that, in the write operation, the controller 101 reads the input data, and then calculates the number of first bit types and the number of second bit types, and then compares the number of the first bit types with the number of second bit types. Accordingly, the controller 101 determines the first retention time and the second retention time of the at least one memory macro i.e., (120-1), and then compares the first retention time with the second retention time. The controller 101 selects the first situation mode in condition if the number of first bit type is greater than the number of the second bit type and the first retention time is greater than the second retention time. The controller 101 selects the second situation mode in condition if the number of first bit type is not greater than the number of the second bit type and the first retention time is not greater than the second retention time. The controller 101, then, disables the flag 110 in response to the controller 101 selects the first situation mode as the selected situation mode. The controller 101 also disables the flag 110 in response to the controller 101 selects the second situation mode as the selected situation mode. Accordingly, in response to the controller 101 disables the flag 110, the controller, then, writes the input data into the at least one memory macro (i.e., 120-1). That is, the controller 101 disables the flag 110 and writes the input data into the at least one memory macro (i.e., 120-1) is response to the input data meets a condition for the selected situation mode. In other words, the greater bit type of the input data is suitable with the greater retention time of the at least one memory macro i.e., (120-1). Thus, the input data is able to be written to the at least one memory macro i.e., (120-1) having the greater retention time. Since the greater retention time of the at least one memory macro i.e., (120-1) has a capability to store data for a long period of time, as results, the correctness of the data is able to be maintained. Moreover, since the at least one memory macro i.e., (120-1) stores the input data having the suitable bit type with the retention time of the at least one memory macro i.e., (120-1) having a capability to store the input data for a long period of time, the wear time of the memory device 100 is able to be optimized.

In this embodiment, in response to the input data is not meet the selected situation mode, the controller 101 enables the flag 110, inverts the input data, and writes an inverted input data into the at least one memory macro (i.e., 120-1).

As described in the previous part that, in the write operation, the controller 101 reads the input data, and then calculates the number of first bit types and the number of second bit types, and then compares the number of the first bit types with the number of second bit types. Accordingly, the controller 101 determines the first retention time and the second retention time of the at least one memory macro i.e., (120-1), and then compares the first retention time with the second retention time. The controller 101 selects the second situation mode instead of the first situation mode in condition if the first retention time is not greater than the second retention time. Since the number of first bit type is greater than the number of second bit type, however the second situation mode other than the first situation mode is selected, thus the input data does not meet a condition for the selected situation mode. The controller 101, then, enables the flag 110 is response to the input data does not meet a condition for the selected situation mode. The controller further inverts the input data and writes an inverted input data into the at least one memory macro (i.e., 120-1) in compliance with the flag 110 is enabled. The process of inverting the input data is already well known by the skill person, so that, the process will not be described. The inverted input data may be the data that has different value with the input data. For example, if the input data is "0" then the inverted input data is "1", or vises versa. If the input data is "1" then the inverted input data is "−1". The value of the input data and the inverted data as well as the process of inverting the input data is already well known by the skill person. That is, the controller 101 enables the flag 110, inverts the input data, and writes the inverted input data into the at least one memory macro (i.e., 120-1) is response to the input data does not meet a condition for the selected situation mode. In other words, the greater bit type of the inverted input data is suitable with the greater retention time of the at least one memory macro i.e., (120-1). Thus, the inverted input data is able to be written to the at least one memory macro i.e., (120-1) having the greater retention time. Since the greater retention time of the at least one memory macro i.e., (120-1) has a capability to store data for a long period of time, as results, the correctness of the data is able to be maintained. Moreover, since the at least one memory macro i.e., (120-1) stores the inverted input data having the suitable bit type with the retention time of the at least one memory macro i.e., (120-1) having a capability to store the input data for a long period of time, the wear time of the memory device 100 is able to be optimized.

In another embodiment, in a read operation of the at least one memory macro (i.e., 120-1), the controller 101 determines that the flag is disabled or enabled. The read operation is conducted by the controller 101 by reading the stored data from at least one memory macro (i.e., 120-1). As described in the previous part, the flag 110 may be set to "0" or "1". For example, the controller 101 may disables the flag 110 by setting the flag 110 to "0". The controller 101 may enables the flag 110 by setting the flag 110 to "1".

During the read operation, the controller 101 reads the stored data in the at least one memory macro (i.e., 120-1). The controller 101 also reads the stored data in the at least one memory macro (i.e., 120-1). The controller 101 may reads the stored data in the memory array 105. The controller 101 further determines whether the flag 110 is disabled or enabled. For example, the flag 110 is disabled if the flag value is "0", and the flag 110 is enabled if the flag value is "1".

In this embodiment, in response to the flag 110 is disabled, the controller 101 reads the data stored in the at least one memory macro (i.e., 120-1) as a read data. For example, the controller 101 read the flag value stored in the memory array (105). The controller 101, then, determines that the flag 110 is disabled if the flag value is "0". The controller 101 further read the data stored in the at least one memory macro (i.e., 120-1). The controller 101 further determines the data stored in the at least one memory macro (i.e., 120-1) as the read data in response to the flag value is "0". That is, the controller 101 reads the data stored in the at least one memory macro (i.e., 120-1) as the read data according to the flag is disabled.

In this embodiment, in response to the flag 110 is enabled, the controller 101 reads the data stored in the at least one memory macro (i.e., 120-1) as an intermediate data, inverts the intermediate data and takes an inverted intermediate data as the read data. The intermediate data is a data that may be not the same with the data. For example, the controller 101 read the flag value stored in the memory array (105). The controller 101, then, determines that the flag 110 is enabled if the flag value is "1". The controller 101 further read the data stored in the at least one memory macro (i.e., 120-1). The controller 101 further determines the data stored in the at least one memory macro (i.e., 120-1) as the intermediate data in response to the flag value is "1". The controller 101 further inverts the intermediate data. The controller 101 further takes the inverted intermediate data as the read data. The inverted intermediate data may have different value with the intermediate data. For example, if the intermediate data is "0" then the inverted intermediate data is "1", or vises versa. If the intermediate data is "1" then the inverted intermediate data is "4", or vises versa. That is, the controller 101 reads the data stored in the at least one memory macro (i.e., 120-1) as an intermediate data, inverts the intermediate data and takes the inverted intermediate data as the read data in response to the flag 110 is enabled.

In another embodiment, in the write operation of the at least one memory macro (i.e., 120-1), the controller 101 performs an error correcting code (ECC) write scheme of the input data for generating an ECC code within the input data before the controller 101 determines that an input data meets a condition for the selected situation mode or not. The ECC write scheme may be implemented using forward error correction by adding redundancy to the data using an algorithm. A redundant bit may be a complex function of the data bits. The ECC code may be generated from the redundant bit of the data.

The process of implementing the ECC write scheme during the write operation is described as follows. The controller 101 reads the input data and performs the ECC write scheme. The controller 101 generates the ECC code according to the ECC write scheme implemented in the input data. The controller 101 further combines the ECC code with the input data to generate a combination data. The controller further compares the number of first bit type and the number of second bit type of the combination data. Accordingly, the controller 101 obtain the first retention time and the second retention time of the at least one memory macro (i.e., 120-1). The controller 101 further determines the selected situation mode according to the comparison result of the first retention time and the second retention time. The controller 101 further writes the combination data to the at least one memory macro (i.e., 120-1) according to the selected situation mode and the comparison result of the number of first bit type and the number of second bit type. That is, the controller 101 is able to perform the ECC write scheme of the input data for generating the ECC code within the input data before the controller 101 determines that the input data meets a condition for the selected situation mode or not.

In another embodiment, in the read operation of the at least one memory macro (i.e., 120-1), the controller 101 performs an ECC checking scheme of the read data according to the ECC code within the read data after the controller generates the read data. The ECC checking scheme may be implemented using a suitable hash function or specifically, a checksum, cyclic redundancy check or other algorithm.

The process of implementing the ECC checking scheme during the read operation is described as follows. The controller 101 reads the data stored in the at least one memory macro (i.e., 120-1). Accordingly, the controller 101 reads the flag 110 stored in the memory array 105. The controller 101 further determines whether the flag 110 is disabled or enabled. If the flag 110 is disabled, the controller 101 applies the data stored in the at least one memory macro (i.e., 120-1) as the read data. However, if the flag 110 is enabled, the controller 101 inverts the data stored in the at least one memory macro (i.e., 120-1), and applied the inverted data as the read data. The controller 101 further read the ECC code within the read data. The controller 101 further performs the ECC checking scheme to the ECC code. That is, the controller 101 is able to perform the ECC checking scheme of the read data according to the ECC code within the read data after the controller 101 generates the read data.

In another embodiment, a method for accessing a memory device, wherein the memory device comprises a flag and a memory array with at least one memory macro, each bit of data stored in the at least one memory macro is presented as a first bit type or a second bit type. The memory device may be the memory device 100, the memory array may be the memory array 105, the flag may be the flag 110, and at least one memory macro may be the at least memory macro (i.e., 120-1). Moreover, a first bit type and a second bit type may be the first bit type and the second bit type as described in the previous part. That is, the method may be implemented by the memory device 100, as described in the previous part. The method may perform the steps conducted by the memory device 100.

Figure 2A:
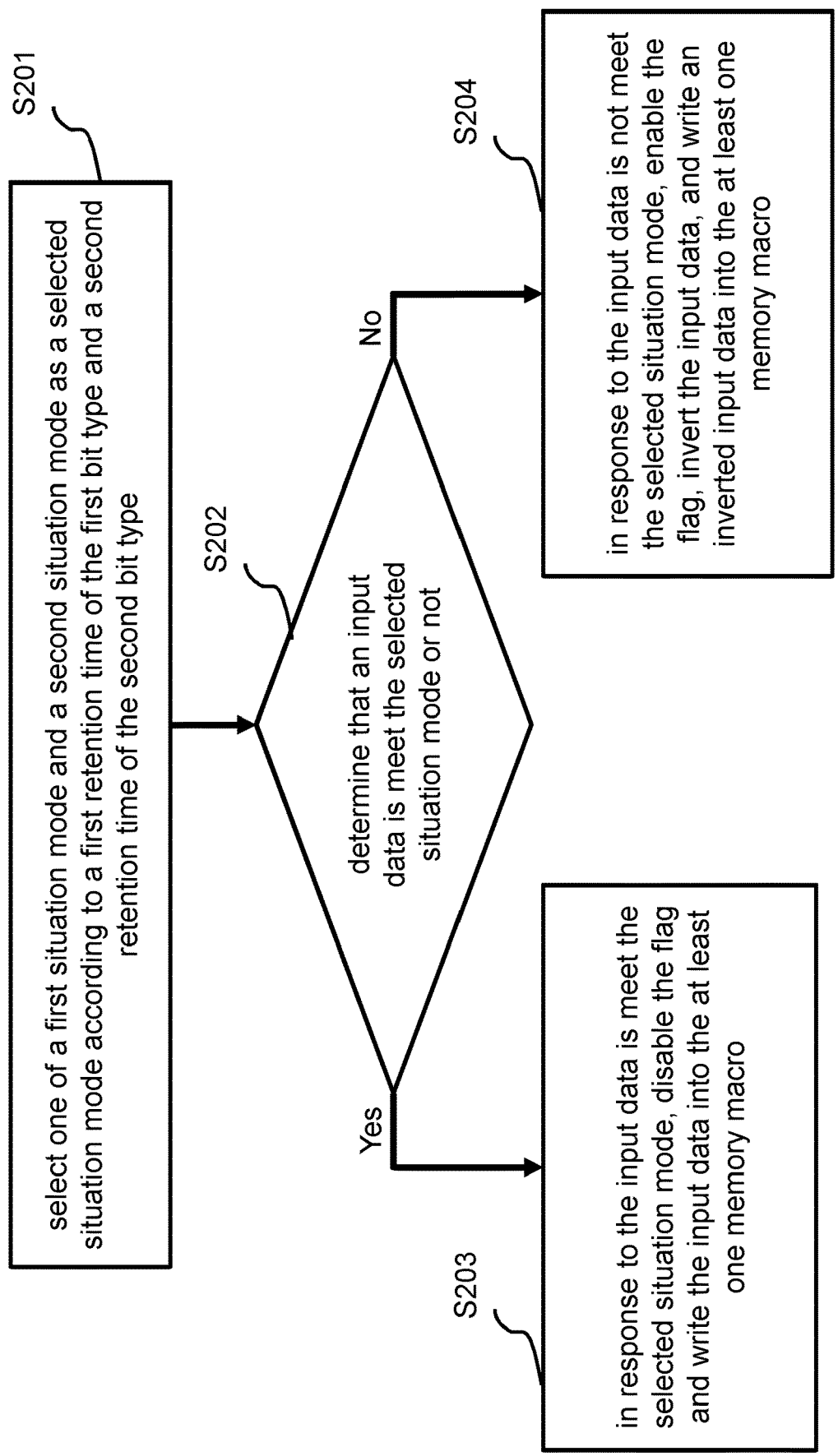
FIG. 2A illustrates a flowchart diagram illustrating steps of a write operation of the at least one memory macro according to an embodiment of the disclosure.

FIG. 2A illustrates a flowchart diagram illustrating steps of a write operation of the at least one memory macro according to an embodiment of the disclosure.

Referring to FIG. 2A, the write operation of the at least one memory macro (i.e., 120-1) is conducted by the controller 101.

In this exemplary embodiment, a step of selecting one of a first situation mode and a second situation mode as a selected situation is conducted by step S201. The selected situation mode is obtained according to a first retention time of the first bit type of the at least one memory macro (i.e., 120-1) and a second retention time of the second bit type of the at least one memory macro (i.e., 120-1). The first situation mode is that a number of bits with the first bit type in data is larger than a number of bit with the second bit type in data. The second situation mode is that the number of bit with the first bit type in data is not larger than the number of bits with the second bit type in data. The step S201 will be further elaborated in FIG. 3A. In step S202, an input data is determined whether or not meet the selected situation mode. In step S203, in response to the input data meets a condition for a condition for the selected situation mode (step S202 is Yes), the flag is disabled and the input data is written into the at least one memory macro (i.e., 120-1). In step S204, on the other hand, in response to the input data does not meet a condition for the selected situation mode (step S202 is No), the flag is enabled, the input data is inverted, and an inverted input data is written into the at least one memory macro (i.e., 120-1). The step of whether or not the input data meets a condition for the selected situation mode (S202) and the steps of whether the flag is disable or enable and whether or not the input data is inverted (S203-S204) will be further elaborated in FIG. 3B.

Figure 2B:
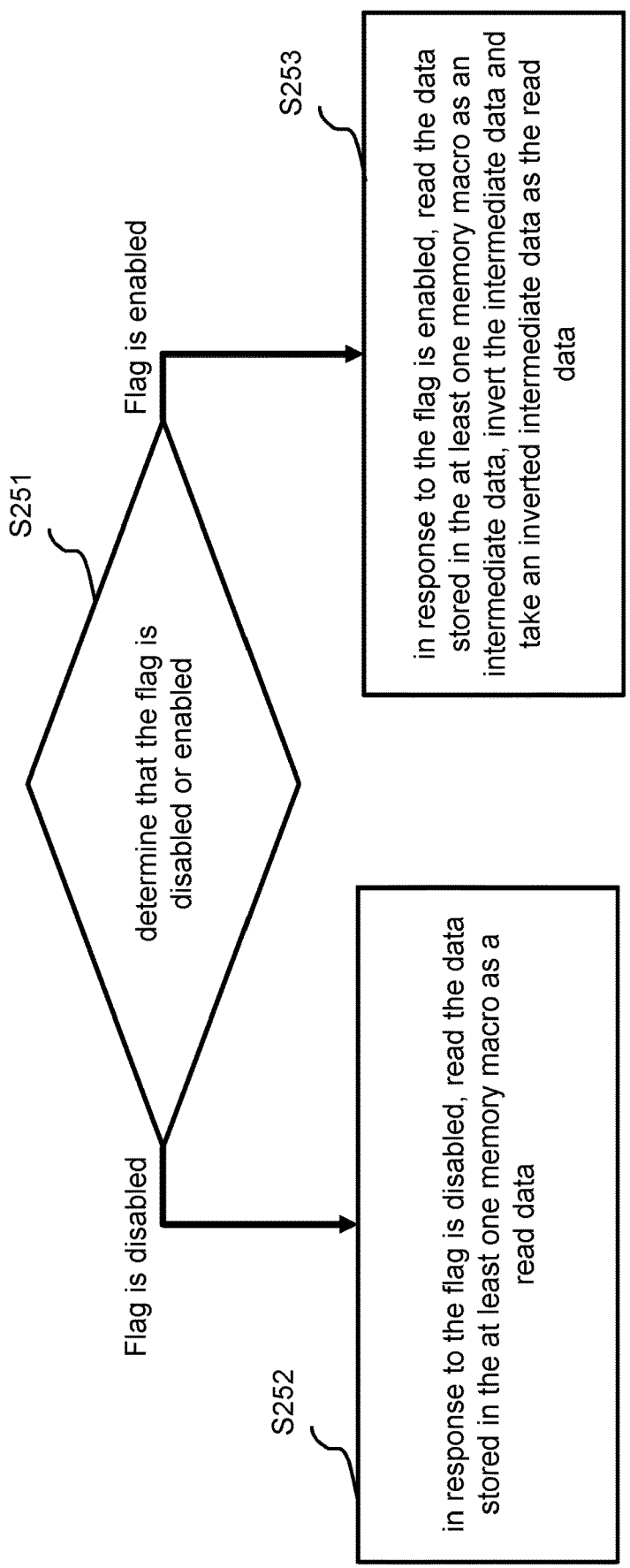
FIG. 2B illustrates a flowchart diagram illustrating steps of a read operation of the at least one memory macro according to an embodiment of the disclosure.

FIG. 2B illustrates a flowchart diagram illustrating steps of a read operation of the at least one memory macro according to an embodiment of the disclosure.

Referring to FIG. 2B, the read operation of the at least one memory macro (i.e., 120-1) is conducted by the controller 101.

In this exemplary embodiment, a step of determining that the flag is disabled or enabled is conducted by step S251. In step S252, in response to the flag is disabled, the data stored in the at least one memory macro is read as a read data. In step S253, in response to the flag is enabled, the data stored in the at least one memory macro is read as an intermediate data, the intermediate data is inverted and an inverted intermediate data is taken as the read data. The steps of determining whether or not the flag is enabled and determining the read data according to the stored data in the at least one memory macro (i.e., 120-1) will be further elaborated in FIG. 6.

Figure 3A:
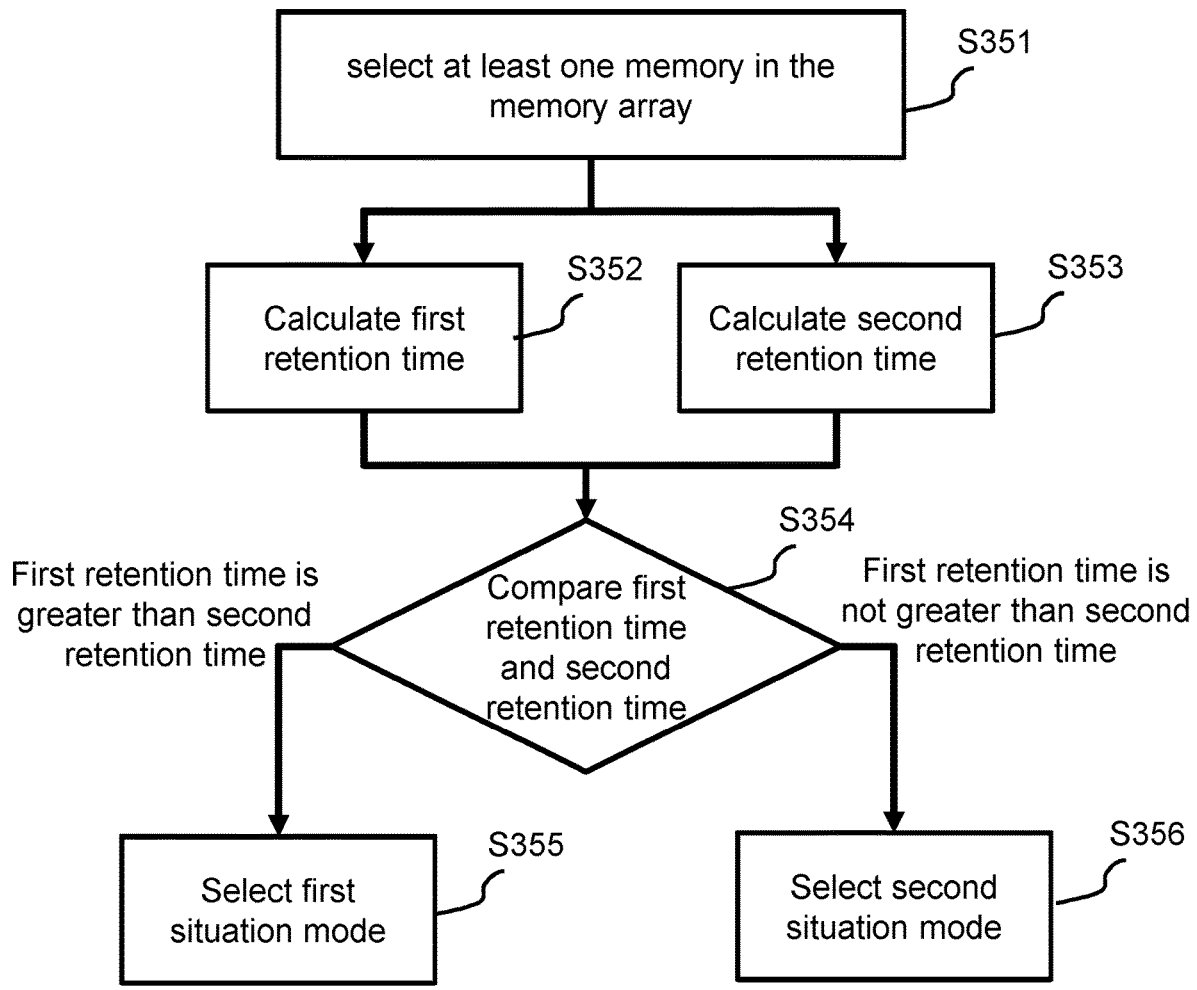
FIG. 3A illustrates a flowchart diagram illustrating steps of determining a first situation mode or a second situation mode of at least one memory macro in a memory array according to an embodiment of the disclosure.

In compliance with the methods described in FIG. 2A, FIG. 3A illustrates a flowchart diagram illustrating steps of determining a first situation mode or a second situation mode of at least one memory macro in a memory array according to an embodiment of the disclosure.

Referring to FIG. 3A, the situation mode of the at least one memory macro (i.e., 120-1) in the memory array 105 includes the first situation mode and the second situation mode.

In this exemplary embodiment, the steps of determining the first situation mode or the second situation mode of at least one memory macro (i.e., 120-1) in a memory array 105 are conducted by step S351 by selecting at least one memory macro (i.e., 120-1) in the memory array 105, then calculating a retention time of each bit type in step S352 and step S353. As mentioned in the previous part, each memory cell (i.e., 130-1) in the memory macro (i.e., 120-1) has two bit types including the first bit type and the second bit type. For instance, each memory cell (i.e., 130-1) in the memory macro (i.e., 120-1) has two phase including phase "H" and phase "L", in which the first bit type corresponds to phase "H", and the second bit type corresponds to phase "L". On the other hand, the retention time of phase "H" may correspond to the first retention time, and the retention time of phase "L" may correspond to the second retention time. The retention time of the memory cell (i.e., 130-1) may depend on the semiconductor manufacturing technology used in the manufacturing process of the memory device. The first retention time may have different value than the second retention time. The first retention time may be higher than the second retention time. The first retention time may be not higher than the second retention time. After calculating the first retention time and the second retention time, then to be continued to step S354 by comparing the first retention time and the second retention time. If the first retention time is greater than the second retention time then the process is continued to step S355 by selecting the first situation mode. If the first retention time is not greater than the second retention time then then the process is continued to step S356 by selecting the second situation mode. That is, the first situation mode and the second situation mode correspond to the retention time of the first bit type and the retention time of the second bit type of the memory macro (i.e., 120-1). The first situation mode means that the retention time of the first bit type of the memory macro (i.e., 120-1) is greater than the retention time of the second bit type of the memory macro (i.e., 120-1). The second situation mode means that the retention time of the first bit type of the memory macro (i.e., 120-1) is not greater than the retention time of the second bit type of the memory macro (i.e., 120-1). In other words, the first situation mode or the second situation mode is simply selected according to the comparison of the first retention time and the second retention time of the memory macro (i.e., 120-1).

Figure 3B:
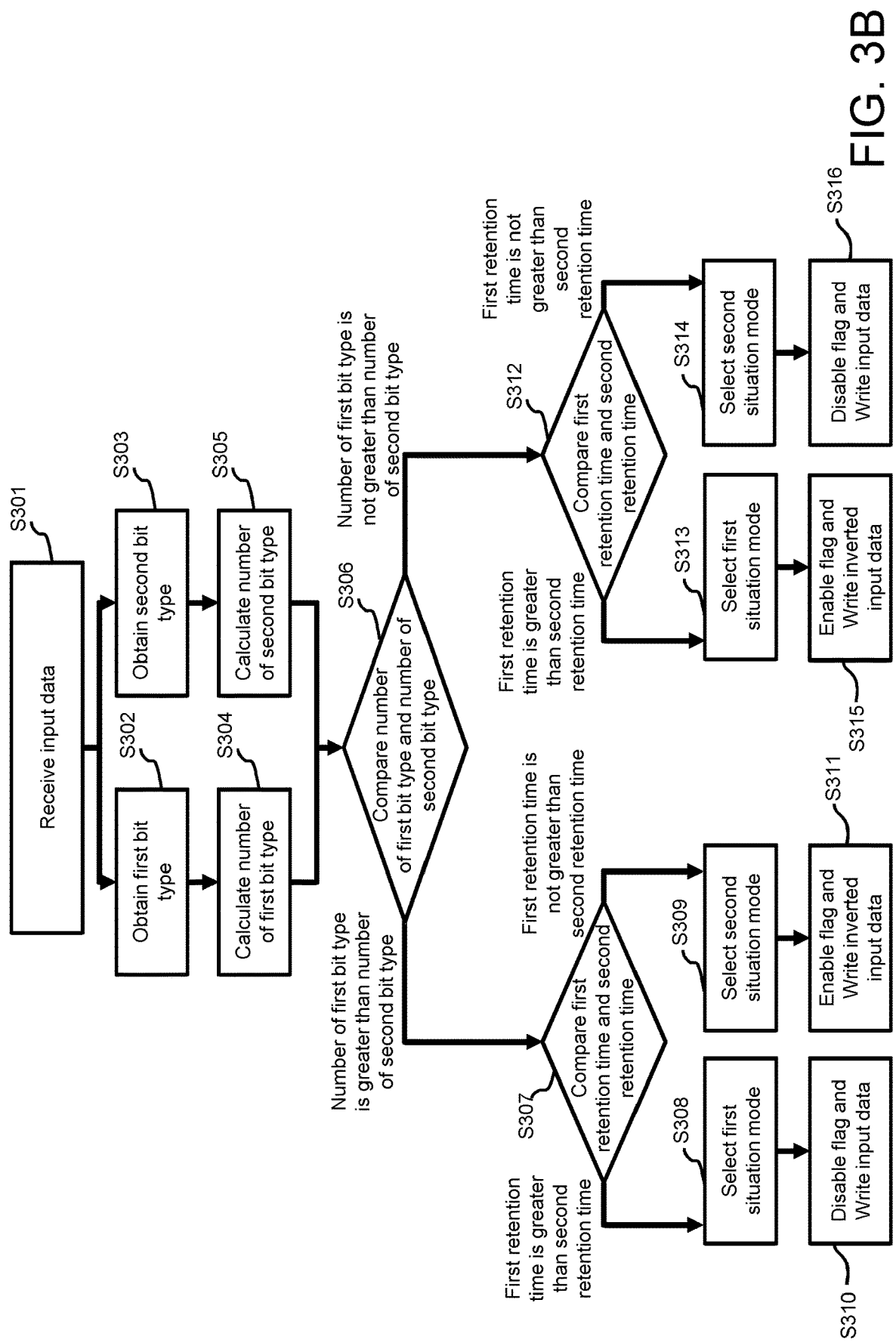
FIG. 3B illustrates a flowchart diagram illustrating steps of writing a flag and input data to at least one memory macro in a memory array according to an embodiment of the disclosure.

In compliance with the methods described in FIG. 2A, FIG. 3B illustrates a flowchart diagram illustrating steps of writing the flag 110 and the input data to at least one memory macro (i.e., 120-1) in a memory array 105 according to an embodiment of the disclosure.

Referring to FIG. 3B, the steps of writing the flag 110 and the input data to at least one memory macro (i.e., 120-1) in a memory array 105 are applied to the input data during write operation.

In this exemplary embodiment, in step S301, the input data is received from an external unit. The input data may include a plurality of bits which is categorized into two different bit types. In step S302, the first bit type is obtained from the input data. The first bit type may correspond to the phase "H" of the memory cell (i.e., 130-1). In step S303, the second bit type is obtained from the input data. The second bit type may correspond to the phase "L" of the memory cell (i.e., 130-1). In step S304 and step S305, number of first bit type and second bit type obtained from the input data is calculated. In step S306, the number of the first bit type is compared with the number of the second bit type. If the number of the first bit type is greater than the number of the second bit type then step S307 is applied by comparing the first retention time and the second retention time of the memory macro (i.e., 120-1). If the first retention time is greater than the second retention time then applying step S308 by selecting the first situation mode. If the first retention time is not greater than the second retention time then applying step S309 by selecting the second situation mode. Since the first situation mode and the second situation mode have been previously described, the description will not be repeated hereinafter. In step S310, in response to the selected first situation mode, the flag 110 in the memory array 105 is disabled and the input data is written to the memory macro (i.e., 120-1) in the memory array 105 as the stored data. And then, in step S311, in response to the selected second situation mode, the flag 110 in the memory array 105 is enabled, the input data is inverted, and the inverted input data is written to the memory macro (i.e., 120-1) in the memory array 105 as the stored data. On the other hand, if the number of the first bit type is not greater than the number of the second bit type then step S312 is applied by comparing the first retention time and the second retention time of the memory macro (i.e., 120-1). If the first retention time is greater than the second retention time then applying step S313 by selecting the first situation mode. If the first retention time is not greater than the second retention time then applying step S314 by selecting the second situation mode. In step S315, in response to the selected first situation mode, the flag 110 in the memory array 105 is enabled, the input data is inverted, and the inverted input data is written to the memory macro (i.e., 120-1) in the memory array 105 as the stored data. And then, in step S316, in response to the selected second situation mode, the flag 110 in the memory array 105 is disabled and the input data is written to the memory macro (i.e., 120-1) in the memory array 105 as the stored data.

Figure 4:
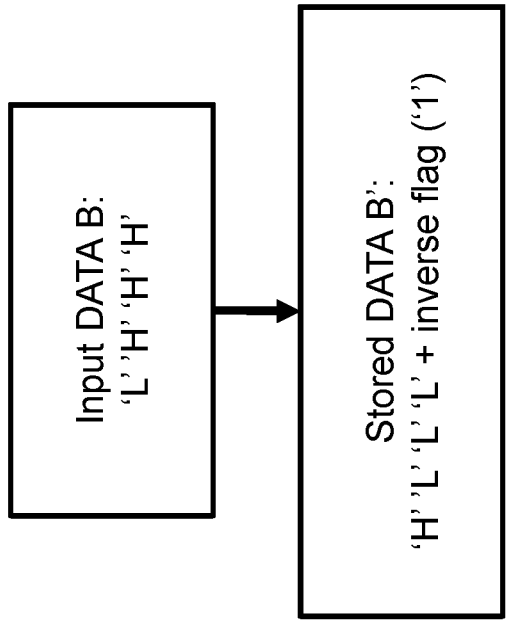
FIG. 4 illustrates a block diagram of two different cases of write operation in condition that a retention time of phase "L" is greater than a retention time of phase "H" according to an embodiment of the disclosure.
Figure 4:
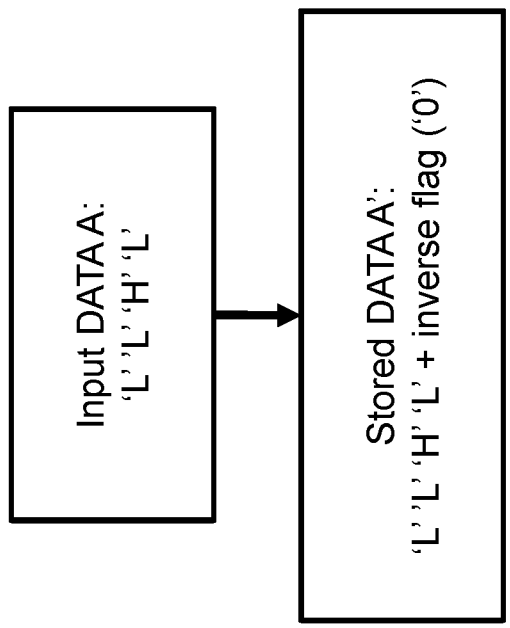

FIG. 4 illustrates a block diagram of two different cases of the write operation in condition that a retention time of phase "L" is greater than a retention time of phase "H" according to an embodiment of the disclosure.

Referring to FIG. 4, the write operation in condition that a retention time of phase "L" is greater than a retention time of phase "H" has two different cases which includes Case 4A and Case 4B.

In this exemplary embodiment, the Case 4A is applied in condition that the number of the first bit type in the input data is not greater than the number of the second bit type. For instance, the input data includes 4-bit, in which the first bit corresponds to phase "L", the second bit corresponds to phase "L", the third bit corresponds to phase "H", and the fourth bit corresponds to phase "L". Since the input data has greater number of phase "L" than phase "H", and the retention time of phase "L" in the memory macro (i.e., 120-1) is greater than the retention time of phase "H" in the memory macro (i.e., 120-1), then the flag 110 in the memory array 105 is disabled and the input data is written to the memory macro (i.e., 120-1) as a stored data. The disabled flag 110 corresponds to bit "0", and the stored data corresponds to 4-bit with phase "L", "L", "H", and "L" respectively.

In this exemplary embodiment, the Case 4B is applied in condition that the number of the first bit type in the input data is greater than the number of the second bit type. For instance, the input data includes 4-bit, in which the first bit corresponds to phase "L", the second bit corresponds to phase "H", the third bit corresponds to phase "H", and the fourth bit corresponds to phase "H". Since the input data has greater number of phase "H" than phase "L", and the retention time of phase "L" in the memory macro (i.e., 120-1) is greater than the retention time of phase "H" in the memory macro (i.e., 120-1), then the flag 110 in the memory array 105 is enabled, the input data is inverted, and the inverted input data is written to the memory macro (i.e., 120-1) as the stored data. The enabled flag 110 corresponds to bit "1", and the stored data corresponds to 4-bit with phase "H", "L", "L", and "L" respectively.

Figure 5:
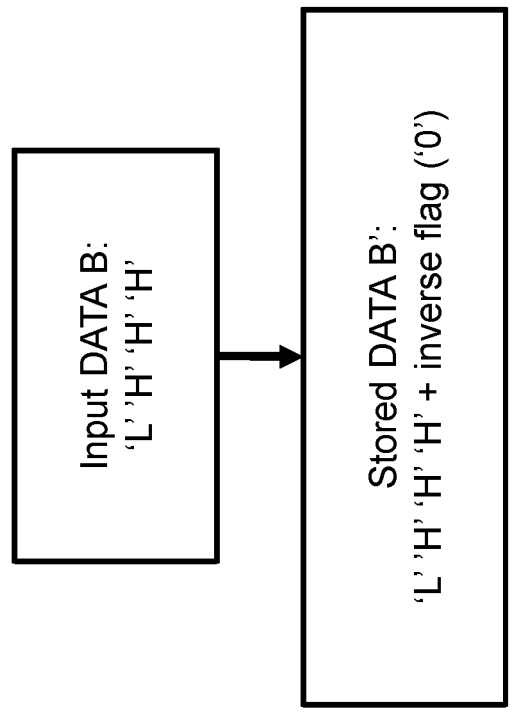
FIG. 5 illustrates a block diagram of two different cases of write operation in condition that a retention time of phase "H" is greater than a retention time of phase "L" according to an embodiment of the disclosure.
Figure 5:
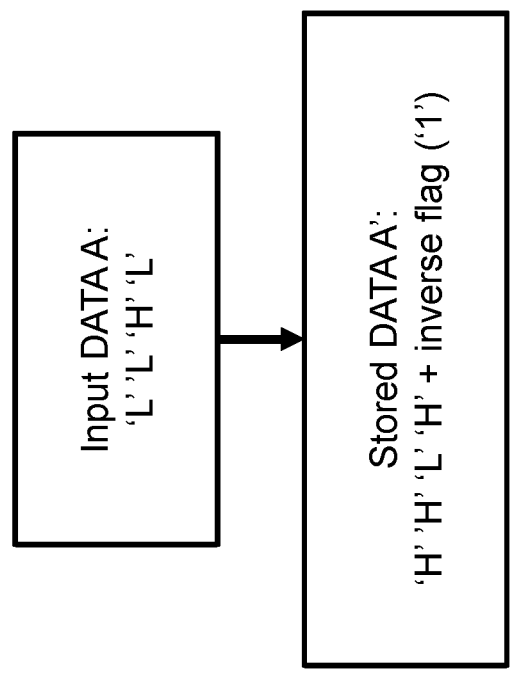

FIG. 5 illustrates a block diagram of two different cases of the write operation in condition that a retention time of phase "H" is greater than a retention time of phase "L" according to an embodiment of the disclosure.

Referring to FIG. 5, the write operation in condition that a retention time of phase "H" is greater than a retention time of phase "L" has two different cases which includes Case 5A and Case 5B.

In this exemplary embodiment, the Case 5A is applied in condition that the number of the first bit type in the input data is not greater than the number of the second bit type. For instance, the input data includes 4-bit, in which the first bit corresponds to phase "L", the second bit corresponds to phase "L", the third bit corresponds to phase "H", and the fourth bit corresponds to phase "L". Since the input data has greater number of phase "L" than phase "H", and the retention time of phase "H" in the memory macro (i.e., 120-1) is greater than the retention time of phase "L" in the memory macro (i.e., 120-1), then the flag 110 in the memory array 105 is enabled, the input data is inverted, and the inverted input data is written to the memory macro (i.e., 120-1) as a stored data. The enabled flag 110 corresponds to bit "1", and the stored data corresponds to 4-bit with phase "H", "H", "L", and "H" respectively.

In this exemplary embodiment, the Case 5B is applied in condition that the number of the first bit type in the input data is greater than the number of the second bit type. For instance, the input data includes 4-bit, in which the first bit corresponds to phase "L", the second bit corresponds to phase "L", the third bit corresponds to phase "H", and the fourth bit corresponds to phase "H". Since the input data has greater number of phase "H" than phase "L", and the retention time of phase "H" in the memory macro (i.e., 120-1) is greater than the retention time of phase "L" in the memory macro (i.e., 120-1), then the flag 110 in the memory array 105 is disabled and the input data is written to the memory macro (i.e., 120-1) as a stored data. The disabled flag 110 corresponds to bit "0", and the stored data corresponds to 4-bit with phase "L", "H", "H", and "H" respectively.

That is, during the write operation, whether or not the flag 110 is enabled and whether or not the input data is inverted are depend on the retention time of phase "H" and phase "L" in the memory macro (i.e., 120-1) and the number of bits with phase "H" and phase "L" in the input data.

Figure 6:
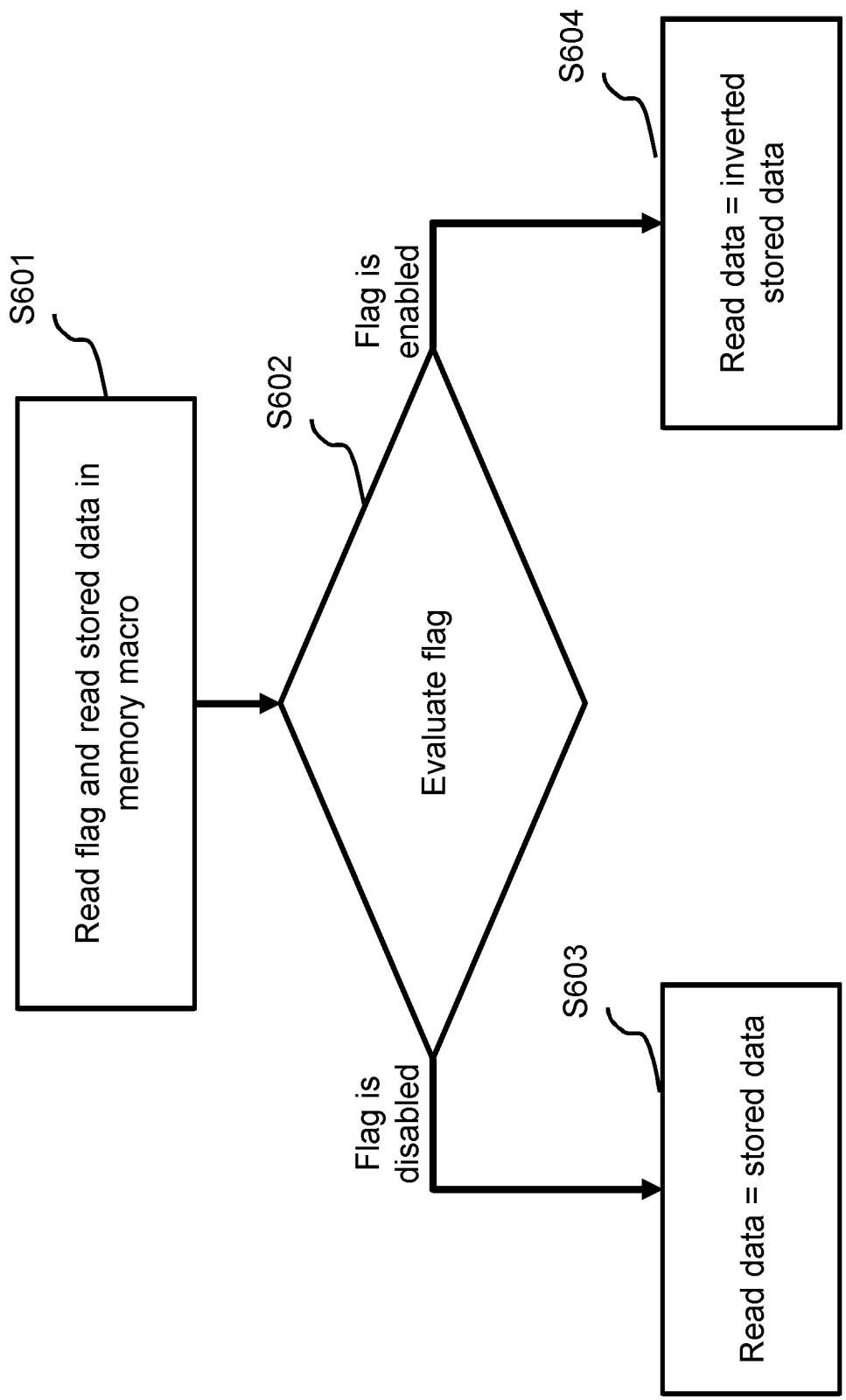
FIG. 6 illustrates a flowchart diagram illustrating steps of reading a flag and reading a stored data from at least one memory macro in a memory array according to an embodiment of the disclosure.

In compliance with the methods described in FIG. 2B, FIG. 6 illustrates a flowchart diagram illustrating steps of reading the flag 110 and reading a stored data from at least one memory macro (i.e., 120-1) in a memory array 105 according to an embodiment of the disclosure.

Referring to FIG. 6, the steps of reading the flag 110 and reading the stored data from at least one memory macro (i.e., 120-1) in the memory array 105 may be performed during the read operation.

In this exemplary embodiment, in step S601, the flag 110 in the memory array 105 and the stored data in the memory macro (i.e., 120-1) of the memory array 105 are read. In step S602, the flag 110 in the memory array 105 is evaluated whether being disabled or enabled. If the flag 110 in the memory array 105 is disabled then the stored data in the memory macro (i.e., 120-1) of the memory array 105 is read and taken as a read data. If the flag 110 in the memory array 105 is enabled then the stored data in the memory macro (i.e., 120-1) of the memory array 105 is read and then assigned as the intermediate data. The intermediate data is inverted and then taken as the read data. The read data is then outputted as the output data. That is, during read operation, whether or not the stored data in the memory macro (i.e., 120-1) of the memory array 105 is inverted and taken as the read data is depend on whether or not the flag 110 in the memory array 105 is enabled. The read data outputted as the output data is the same as the corresponding input data written in the memory macro (i.e., 120-1) as the stored data. As results, the wear time of the memory device 100 can be optimized, the lower error rate can be achieved, and the power energy for refresh operation can be reduced.

Figure 7:
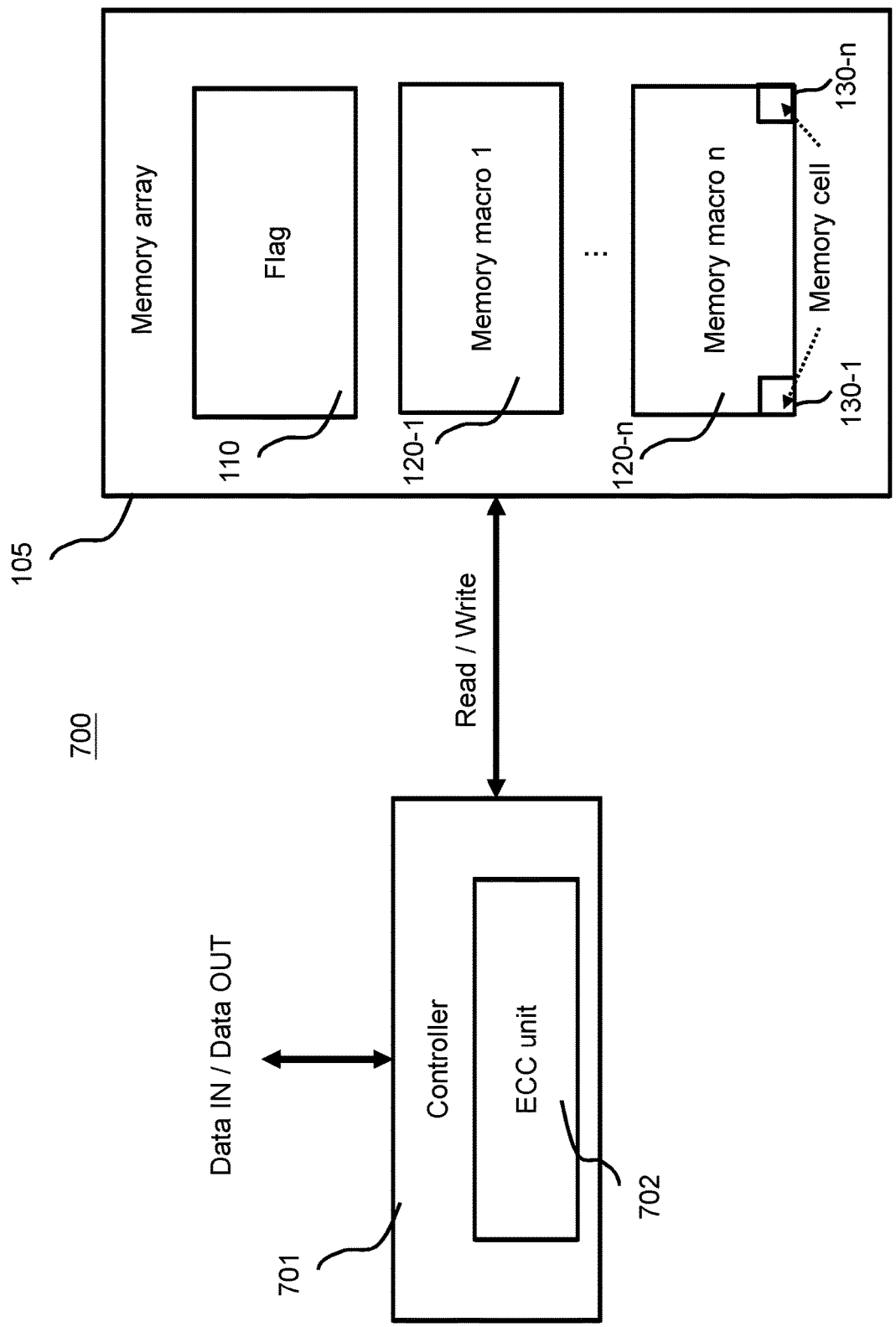
FIG. 7 illustrates a block diagram of a memory device including a controller and a memory array including a plurality of memory macros and a flag for indicating an asymmetric data store in a memory array according to an embodiment of the disclosure.

FIG. 7 illustrates a block diagram of a memory device 100 including the controller 101 and a memory array 105 including a plurality of memory macros (i.e., 120-1 to 120-n) and the flag 110 for indicating an asymmetric data store in a memory array 105 according to an embodiment of the disclosure.

Referring to FIG. 7, the memory device 700 includes a controller 701 and the memory array 105.

In this exemplary embodiment, similarly to the memory device 100 illustrated in FIG. 1, the memory device 700 includes the controller 701 and the memory array 105. However, the controller 701 of the memory device 700 includes the error checking and correcting (ECC) unit 702. The input data is processed in the ECC unit 702 before the input data is written to the memory macro (i.e., 120-1) in the memory array 105 as the stored data according to the situation mode. The read data is processed in the ECC unit 702 and then outputted as the output data after the read data is read from the stored data in the memory macro (i.e., 120-1) of the memory array 105 according to the situation mode. The ECC unit 702 may be included inside the controller 701 or may be located outside the controller 701. The memory array 105 of the memory device 700 is not limited to include one flag and a plurality of the memory macros. The memory array 105 of the memory device 700 may include one flag and one memory macro. The memory array 105 of the memory device 700 may include a plurality of flags and the plurality of the memory macros. Each flag may correspond to each memory macro (i.e., 120-1 to 120-n). Each flag may correspond to more than one memory macro (i.e., 120-1). Each flag may correspond to some memory macros (i.e., 120-1) distributed equally. Each flag may correspond to some memory macros (i.e., 120-1 to 120-n) distributed arbitrarily.

Figure 8:
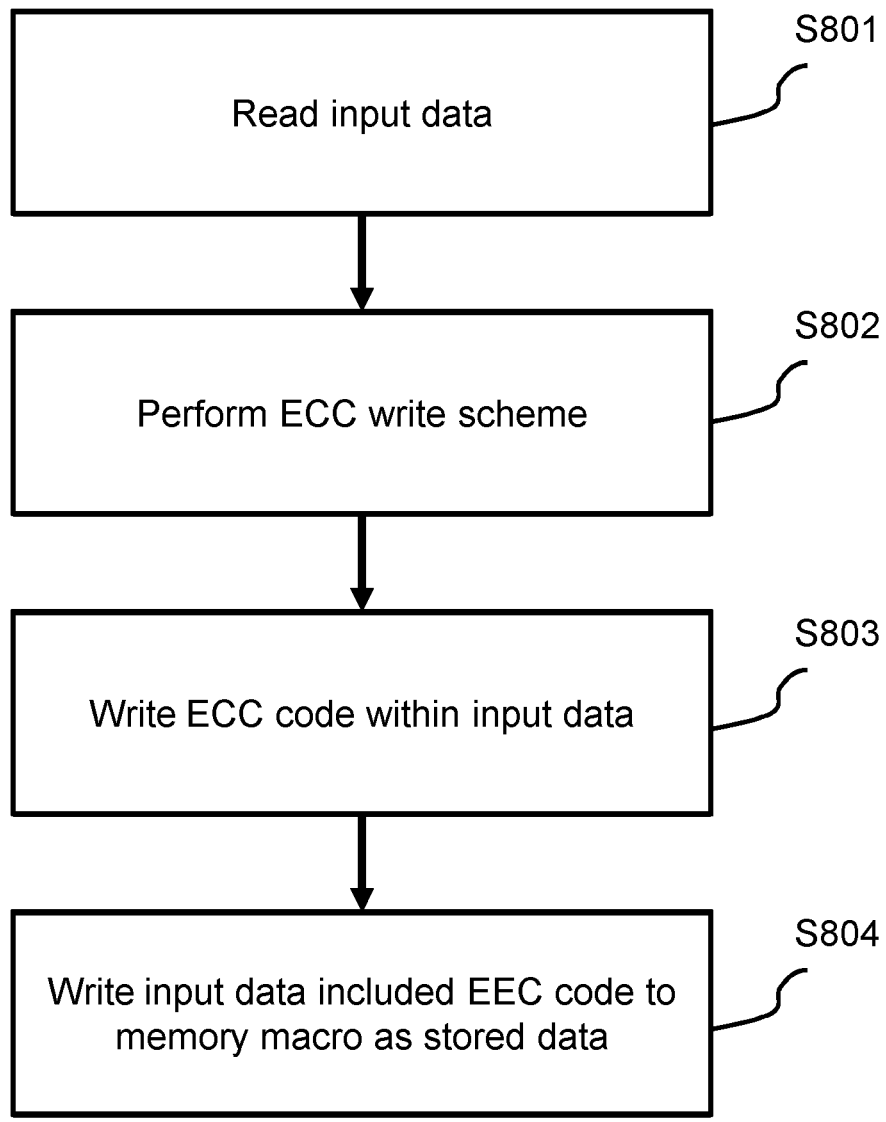
FIG. 8 illustrates a flowchart diagram illustrating steps of performing an error checking and correcting (ECC) during write operation according to an embodiment of the disclosure.

FIG. 8 illustrates a flowchart diagram illustrating steps of performing the error checking and correcting (ECC) during the write operation according to an embodiment of the disclosure.

Referring to FIG. 8, the steps of performing the ECC during the write operation is conducted to the input data.

In this exemplary embodiment, in step S801, the controller 701 reads the input data. In step S802, the ECC unit 702 performs the ECC write scheme to the input data, and then generates an ECC code. In step S803, the ECC unit 702 writes the ECC code within the input data, so that the current input data includes the input data read by the controller 701 and the ECC code generated by the ECC unit 702. In step S804, the current input data is written to the memory macro (i.e., 120-1) in the memory array 105 according to the situation mode. Accordingly, the flag 110 in the memory array 105 is enabled or disabled according to the situation mode.

Figure 9:
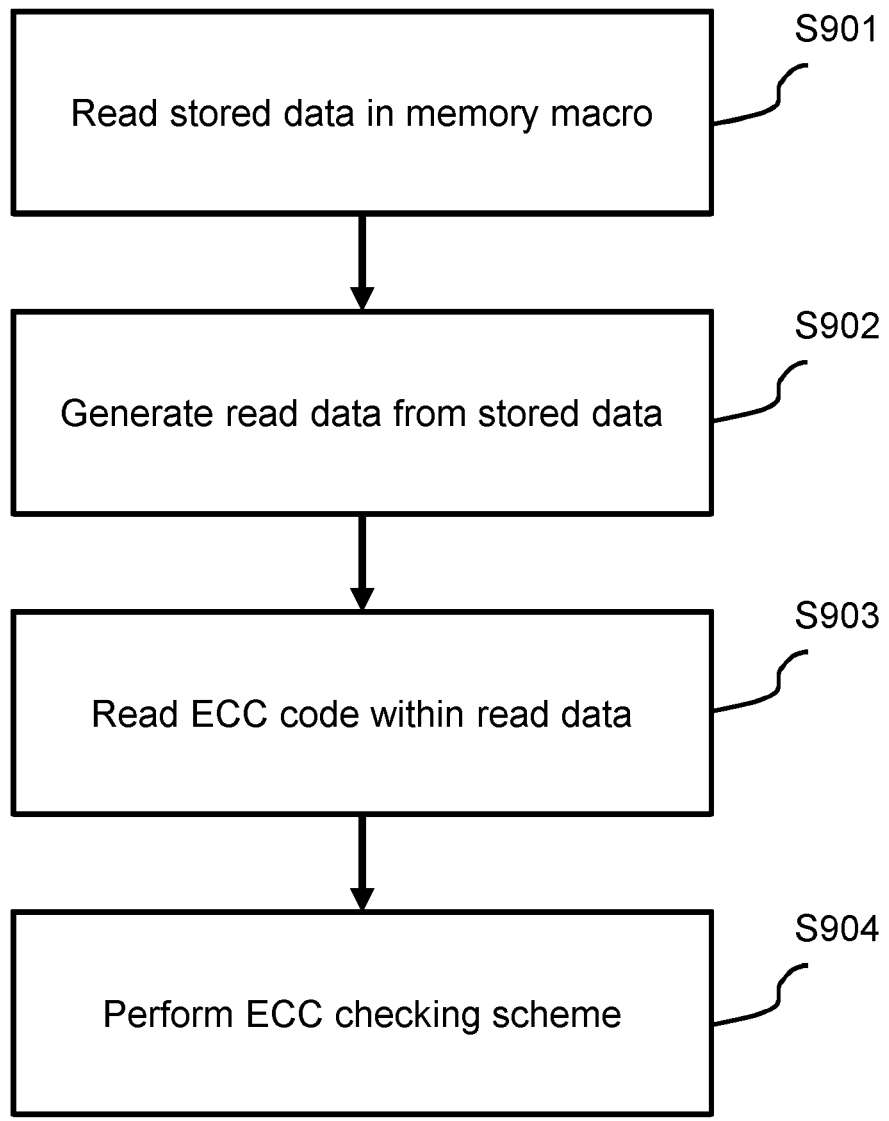
FIG. 9 illustrates a flowchart diagram illustrating steps of performing an error checking and correcting (ECC) during read operation according to an embodiment of the disclosure.

FIG. 9 illustrates a flowchart diagram illustrating steps of performing the error checking and correcting (ECC) during the read operation according to an embodiment of the disclosure.

Referring to FIG. 9, the steps of performing the ECC during the read operation is conducted to the stored data.

In this exemplary embodiment, in step S901, the controller 701 read the flag 110 in the memory array 105 and the stored data in the memory macro (i.e., 120-1) of the memory array 105. In step S902, the read data is generated from the stored data according to whether the flag 110 is enabled or disabled. Since the ECC code is included within the read data, in step S903, the included ECC code is read by the ECC unit 702. In step S904, the ECC unit 702 performs the ECC checking scheme to the read data, and then the controller 701 outputs the read data checked by the ECC unit 702 as the output data. That is, the ECC unit 702 is able to work with the controller 701, whether the ECC unit 702 is included inside the controller 701 or located outside the controller 701, during the write operation, the read operation, or a combination thereof.

In summary, the asymmetric data store for the memory device (i.e., 100 or 700) and the method therefor is designed and applied for the read operation and the write operation. The memory device (i.e., 100 or 700) includes the controller (i.e., 101 or 701) and the memory array 105. The memory array 105 may include one flag (i.e., 110) and one memory macro (i.e., 120-1). The memory array 105 may include one flag (i.e., 110) and the plurality of the memory macros (i.e., 120-1 to 120-n). The memory array 105 may include the plurality of the flags and the plurality of the memory macros (i.e., 120-1 to 120-n), in which each flag (i.e., 110) corresponds to one memory macro (i.e., 120-1) or the plurality of the memory macros (i.e., 120-1 to 120-n) distributed equally or arbitrarily. During the write operation, whether or not the flag 101 in the memory array 105 is enabled and whether or not the input data is written to the memory macro (i.e., 120-1) of the memory array 105 as the stored data is depend on the situation mode. The situation mode is obtained according to the bit type of the input data and the retention time of the memory macro (i.e., 120-1). During the read operation, the stored data in the memory macro (i.e., 120-1) of the memory array 105 is read as the read data according to whether or not the flag 110 in the memory array 105 is enabled. The memory device 700 may include the ECC unit 702 included in the controller 701 or located outside the controller 701. The ECC unit 702 is able to work with the controller 701 for performing the read operation and the write operation. That is, by applying the above-mentioned memory device (i.e., 100 or 700) and the read/write operation therefor, both the input data and the inverted input data is able to be written to the at least one memory macro i.e., (120-1) having the greater retention time. Since the greater retention time of the at least one memory macro i.e., (120-1) has a capability to store data for a long period of time, as results, the correctness of the data is able to be maintained. Moreover, since the at least one memory macro i.e., (120-1) stores both the input data and the inverted input data having the suitable bit type with the retention time of the at least one memory macro i.e., (120-1) having a capability to store the data for a long period of time, the wear time of the memory device 100 is able to be optimized.

According to some embodiments, a memory device for asymmetric data store is provided. The memory device includes a memory array, a flag, and a controller. The memory array includes at least one memory macro. Each bit of data stored in the at least one memory macro is presented as a first bit type or a second bit type. The controller is coupled to the memory array. The controller is configured to select one of a first situation mode and a second situation mode as a selected situation mode according to a first retention time of the first bit type and a second retention time of the second bit type. The first situation mode is that a number of bits with the first bit type in data is larger than a number of bit with the second bit type in data, and the second situation mode is that the number of bit with the first bit type in data is not larger than the number of bits with the second bit type in data. In a write operation of the at least one memory macro, the controller determines that an input data meets a condition for the selected situation mode or not. In response to the input data meets a condition for the selected situation mode, the controller disables the flag and writes the input data into the at least one memory macro. In response to the input data does not meet a condition for the selected situation mode, the controller enables the flag, inverts the input data, and writes an inverted input data into the at least one memory macro.

According to some embodiments, in a read operation of the at least one memory macro, the controller determines that the flag is disabled or enabled. In response to the flag is disabled, the controller reads the data stored in the at least one memory macro as a read data. In response to the flag is enabled, the controller reads the data stored in the at least one memory macro as an intermediate data, inverts the intermediate data and takes an inverted intermediate data as the read data.

According to some embodiments, in the write operation of the at least one memory macro, the controller performs an error correcting code (ECC) write scheme of the input data for generating an ECC code within the input data before the controller determines that an input data meets a condition for the selected situation mode or not. According to some embodiments, in the read operation of the at least one memory macro, the controller performs an ECC checking scheme of the read data according to the ECC code within the read data after the controller generates the read data. According to some embodiments, the controller selects the first situation mode in response to the first retention time of the first bit type is longer than the second retention time of the second bit type, and the controller selects the second situation mode in response to the first retention time of the first bit type is no longer than the second retention time of the second bit type. According to some embodiments, the flag corresponds to the at least one memory macro. According to some embodiments, the flag represents that data stored in the at least one memory macro has been inverted or not.

According to some embodiments, an access controller of a memory device for asymmetric data store is provided. The memory device comprises a memory array with at least one memory macro. Each bit of data stored in the at least one memory macro is presented as a first bit type or a second bit type. The access controller includes a flag and a controller. The controller is coupled to the memory array. The controller is configured to select one of a first situation mode and a second situation mode as a selected situation mode according to a first retention time of the first bit type and a second retention time of the second bit type. the first situation mode is that a number of bits with the first bit type in data is larger than a number of bit with the second bit type in data, and the second situation mode is that the number of bit with the first bit type in data is not larger than the number of bits with the second bit type in data. In a write operation of the at least one memory macro, the controller determines that an input data meets a condition for the selected situation mode or not. In response to the input data meets a condition for the selected situation mode, the controller disables the flag and writes the input data into the at least one memory macro. In response to the input data does not meet a condition for the selected situation mode, the controller enables the flag, inverts the input data, and writes an inverted input data into the at least one memory macro.

According to some embodiments, in a read operation of the at least one memory macro, the controller determines that the flag is disabled or enabled. In response to the flag is disabled, the controller reads the data stored in the at least one memory macro as a read data. In response to the flag is enabled, the controller reads the data stored in the at least one memory macro as an intermediate data, inverts the intermediate data and takes an inverted intermediate data as the read data.

According to some embodiments, in the write operation of the at least one memory macro, the controller performs an error correcting code (ECC) write scheme of the input data for generating an ECC code within the input data before the controller determines that an input data meets a condition for the selected situation mode or not. According to some embodiments, in the read operation of the at least one memory macro, the controller performs an ECC checking scheme of the read data according to the ECC code within the read data after the controller generates the read data. According to some embodiments, the controller selects the first situation mode in response to the first retention time of the first bit type is longer than the second retention time of the second bit type, and the controller selects the second situation mode in response to the first retention time of the first bit type is no longer than the second retention time of the second bit type. According to some embodiments, the flag corresponds to the at least one memory macro. According to some embodiments, the flag represents that data stored in the at least one memory macro has been inverted or not.

According to some embodiments, a method for accessing a memory device for asymmetric data store is provided. The memory device comprises a flag and a memory array with at least one memory macro. Each bit of data stored in the at least one memory macro is presented as a first bit type or a second bit type. The method includes selecting one of a first situation mode and a second situation mode as a selected situation mode according to a first retention time of the first bit type and a second retention time of the second bit type. The first situation mode is that a number of bits with the first bit type in data is larger than a number of bit with the second bit type in data, and the second situation mode is that the number of bit with the first bit type in data is not larger than the number of bits with the second bit type in data. In a write operation of the at least one memory macro, determining that an input data meets a condition for the selected situation mode or not. In response to the input data meets a condition for the selected situation mode, disabling the flag and writing the input data into the at least one memory macro. In response to the input data does not meet a condition for the selected situation mode, enabling the flag, inverting the input data, and writing an inverted input data into the at least one memory macro.

According to some embodiments, the method further includes, in a read operation of the at least one memory macro, determining that the flag is disabled or enabled. In response to the flag is disabled, reading the data stored in the at least one memory macro as a read data. In response to the flag is enabled, reading the data stored in the at least one memory macro as an intermediate data, inverting the intermediate data and taking an inverted intermediate data as the read data.

According to some embodiments, in the write operation of the at least one memory macro, performing an error correcting code (ECC) write scheme of the input data for generating a ECC code within the input data before determining that an input data meets a condition for the selected situation mode or not. According to some embodiments, in the read operation of the at least one memory macro, performing an ECC checking scheme of the read data according to the ECC code within the read data after generating the read data. According to some embodiments, selecting the first situation mode in response to the first retention time of the first bit type is longer than the second retention time of the second bit type, and selecting the second situation mode in response to the first retention time of the first bit type is no longer than the second retention time of the second bit type. According to some embodiments, the flag represents that data stored in the at least one memory macro has been inverted or not.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device, comprising:
    a memory array with at least one memory macro, wherein each bit of data stored in the at least one memory macro is presented as a first bit type or a second bit type;
    a flag; and
    a controller, coupled to the memory array,
    wherein the controller is configured to select one of a first situation mode and a second situation mode as a selected situation mode according to a first retention time of the first bit type and a second retention time of the second bit type, wherein the first situation mode is that a number of bits with the first bit type in data is larger than a number of bits with the second bit type in data, and the second situation mode is that the number of bits with the first bit type in data is not larger than the number of bits with the second bit type in data, in a write operation of the at least one memory macro, the controller determines that an input data meets a condition for the selected situation mode or not, in response to the input data meets a condition for the selected situation mode, the controller disables the flag and writes the input data into the at least one memory macro, and, in response to the input data does not meet a condition for the selected situation mode, the controller enables the flag, inverts the input data, and writes an inverted input data into the at least one memory macro, wherein the controller determines that the input data meets a condition for the first situation mode as the selected situation mode when the first retention time of the first bit type in the at least one memory macro is greater than the second retention time of the second bit type in the at least one memory macro, wherein the controller determines that the input data does not meet a condition for the first situation mode as the selected situation mode when the first retention time of the first bit type in the at least one memory macro is not greater than the second retention time of the second bit type in the at least one memory macro.

2. The memory device of claim 1, wherein in a read operation of the at least one memory macro, the controller determines that the flag is disabled or enabled, in response to the flag is disabled, the controller reads the data stored in the at least one memory macro as a read data, and, in response to the flag is enabled, the controller reads the data stored in the at least one memory macro as an intermediate data, inverts the intermediate data and takes an inverted intermediate data as the read data.

3. The memory device of claim 2, wherein in the write operation of the at least one memory macro, the controller performs an error correcting code (ECC) write scheme of the input data for generating a ECC code within the input data before the controller determines that the input data meets a condition for the selected situation mode or not.

4. The memory device of claim 3, wherein in the read operation of the at least one memory macro, the controller performs an ECC checking scheme of the read data according to the ECC code within the read data after the controller generates the read data.

5. The memory device of claim 1, wherein the controller selects the first situation mode in response to the first retention time of the first bit type is longer than the second retention time of the second bit type, and, the controller selects the second situation mode in response to the first retention time of the first bit type is no longer than the second retention time of the second bit type.

6. The memory device of claim 1, wherein the flag corresponds to the at least one memory macro.

7. The memory device of claim 1, wherein the flag represents that data stored in the at least one memory macro has been inverted or not.

8. An access controller of a memory device, wherein the memory device comprises a memory array with at least one memory macro, each bit of data stored in the at least one memory macro is presented as a first bit type or a second bit type, wherein the access controller comprising:

a flag; and a controller, coupled to the memory array, wherein the controller is configured to select one of a first situation mode and a second situation mode as a selected situation mode according to a first retention time of the first bit type and a second retention time of the second bit type, wherein the first situation mode is that a number of bits with the first bit type in data is larger than a number of bits with the second bit type in data, and the second situation mode is that the number of bits with the first bit type in data is not larger than the number of bits with the second bit type in data, in a write operation of the at least one memory macro, the controller determines that an input data meets a condition for the selected situation mode or not, in response to the input data meets a condition for the selected situation mode, the controller disables the flag and writes the input data into the at least one memory macro, and, in response to the input data does not meet a condition for the selected situation mode, the controller enables the flag, inverts the input data, and writes an inverted input data into the at least one memory macro, wherein the controller determines that the input data meets a condition for the first situation mode as the selected situation mode when the first retention time of the first bit type in the at least one memory macro is greater than the second retention time of the second bit type in the at least one memory macro, wherein the controller determines that the input data does not meet a condition for the first situation mode as the selected situation mode when the first retention time of the first bit type in the at least one memory macro is not greater than the second retention time of the second bit type in the at least one memory macro.

9. The access controller of the memory device of claim 8, wherein in a read operation of the at least one memory macro, the controller determines that the flag is disabled or enabled, in response to the flag is disabled, the controller reads the data stored in the at least one memory macro as a read data, and, in response to the flag is enabled, the controller reads the data stored in the at least one memory macro as an intermediate data, inverts the intermediate data and takes an inverted intermediate data as the read data.

10. The access controller of the memory device of claim 8, wherein in the write operation of the at least one memory macro, the controller performs an error correcting code (ECC) write scheme of the input data for generating a ECC code within the input data before the controller determines that the input data meets a condition for the selected situation mode or not.

11. The access controller of the memory device of claim 8, wherein in the read operation of the at least one memory macro, the controller performs an ECC checking scheme of the read data according to the ECC code within the read data after the controller generates the read data.

12. The access controller of the memory device of claim 8, wherein the controller selects the first situation mode in response to the first retention time of the first bit type is longer than the second retention time of the second bit type, and, the controller selects the second situation mode in response to the first retention time of the first bit type is no longer than the second retention time of the second bit type.

13. The access controller of the memory device of claim 8, wherein the flag corresponds to the at least one memory macro.

14. The access controller of the memory device of claim 8, wherein the flag represents that data stored in the at least one memory macro has been inverted or not.

15. A method for accessing a memory device, wherein the memory device comprises a flag and a memory array with at least one memory macro, each bit of data stored in the at least one memory macro is presented as a first bit type or a second bit type, wherein the method comprising:

selecting one of a first situation mode and a second situation mode as a selected situation mode according to a first retention time of the first bit type and a second retention time of the second bit type, wherein the first situation mode is that a number of bits with the first bit type in data is larger than a number of bits with the second bit type in data, and the second situation mode is that the number of bits with the first bit type in data is not larger than the number of bits with the second bit type in data;

in a write operation of the at least one memory macro, determining that an input data meets a condition for the selected situation mode or not;

in response to the input data meets a condition for the selected situation mode, disabling the flag and writing the input data into the at least one memory macro; and in response to the input data does not meet a condition for the selected situation mode, enabling the flag, inverting the input data, and writing an inverted input data into the at least one memory macro, wherein the input data is determined to meet a condition for the first situation mode as the selected situation mode when the first retention time of the first bit type in the at least one memory macro is greater than the second retention time of the second bit type in the at least one memory macro, wherein the input data is determined to be not meet a condition for the first situation mode as the selected situation mode when the first retention time of the first bit type in the at least one memory macro is not greater than the second retention time of the second bit type in the at least one memory macro.

16. The method of claim 15, further comprising:

in a read operation of the at least one memory macro, determining that the flag is disabled or enabled;

in response to the flag is disabled, reading the data stored in the at least one memory macro as a read data; and in response to the flag is enabled, reading the data stored in the at least one memory macro as an intermediate data, inverting the intermediate data and taking an inverted intermediate data as the read data.

17. The method of claim 15, wherein in the write operation of the at least one memory macro, performing an error correcting code (ECC) write scheme of the input data for generating an ECC code within the input data before determining that the input data meets a condition for the selected situation mode or not.

18. The method of claim 15, wherein in the read operation of the at least one memory macro, performing an ECC checking scheme of the read data according to the ECC code within the read data after generating the read data.

19. The method of claim 15, wherein selecting the first situation mode in response to the first retention time of the first bit type is longer than the second retention time of the second bit type, and, selecting the second situation mode in response to the first retention time of the first bit type is no longer than the second retention time of the second bit type.

20. The method of claim 15, wherein the flag represents that data stored in the at least one memory macro has been inverted or not.

* * * * *